United States Patent
Truong et al.

[11] Patent Number: 5,877,636
[45] Date of Patent: Mar. 2, 1999

[54] SYNCHRONOUS MULTIPLEXER FOR CLOCK SIGNALS

[75] Inventors: Ho D. Truong, San Jose; Edward H. Yu, Newark; Kathy Ying Chen, Milpitas, all of Calif.

[73] Assignee: Samsung Electronics Co., Ltd., Rep. of Korea

[21] Appl. No.: 733,885

[22] Filed: Oct. 18, 1996

[51] Int. Cl.⁶ .............................. H03K 5/13; H03K 17/00
[52] U.S. Cl. .............................. 327/99; 327/298; 327/407
[58] Field of Search .............................. 327/99, 407–410, 327/291, 292, 293–296, 298, 299, 141, 144, 145, 152; 395/556

[56] References Cited

U.S. PATENT DOCUMENTS

| | | | |
|---|---|---|---|
| 4,644,568 | 2/1987 | Canniff et al. | 375/108 |
| 4,965,524 | 10/1990 | Patchen | 327/99 |
| 5,099,141 | 3/1992 | Utsunomiya | 327/99 |
| 5,357,146 | 10/1994 | Heimann | 327/407 |
| 5,510,742 | 4/1996 | Lemaire | 327/407 |
| 5,652,536 | 7/1997 | Nookala et al. | 327/99 |

*Primary Examiner*—Timothy P. Callahan
*Assistant Examiner*—Eunja Shin
*Attorney, Agent, or Firm*—Skjerven, Morrill, MacPherson, Franklin & Friel, L.L.P.

[57] ABSTRACT

An apparatus for multiplexing a pair of test clock signals and a pair of system clock signals onto a pair of output clock signals includes a first means for coupling a first test clock signal to a first output clock signal when a test mode control signal is active, for driving the first output clock signal to an inactive clock signal level when the test mode control signal transitions to an inactive state, and for coupling a first system clock signal to the first output clock signal beginning with a first full clock pulse of the first system clock signal which occurs after the test mode control signal transitions to the inactive state. The apparatus further includes a second means for coupling a second test clock signal to a second output clock when the test mode control signal is active, for driving the second output clock to the inactive clock signal level when the test mode control signal transitions to the inactive state, and for coupling a second system clock signal to the second output clock beginning with a first full clock pulse of the second system clock signal which occurs after the first full clock pulse of the first system clock signal. When exiting the test mode the apparatus ensures that both first and second output clock signals are brought (or held) to an inactive clock signal level, and that system operation begins with the first system clock signal.

34 Claims, 4 Drawing Sheets

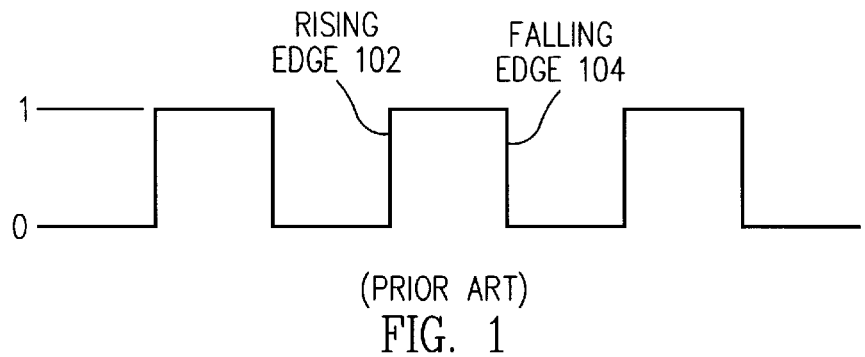
(PRIOR ART)
FIG. 1
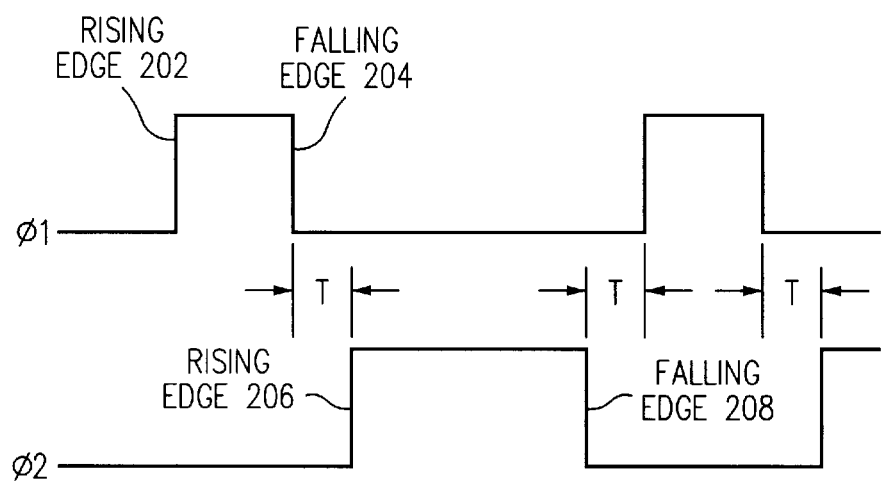
(PRIOR ART)
FIG. 2A
STATE 1: ø1=0, ø2=0
STATE 2: ø1=1, ø2=0
STATE 3: ø1=0, ø2=1
(PRIOR ART)
FIG. 2B

SYNCHRONOUS MULTIPLEXER FOR CLOCK SIGNALS

BACKGROUND OF THE INVENTION

1. Field of the Invention

The present invention relates generally to control of clock signals in digital systems such as, for example, integrated circuits (ICs). More particularly, the present invention relates to synchronously multiplexing clock signals for controlling circuit elements in such a system.

2. Description of the Related Art

Most digital systems (e.g., microprocessor chips) operate as control driven, synchronous sequential systems. This means the sequence of operations in the system is synchronized by a master clock signal (usually an external clock). This clock signal is usually one of the form shown in FIG. 1; which illustrates a square wave with a substantially 50% duty cycle.

The master clock signal allows system operations to occur at regularly spaced intervals. In particular, operations are made to take place at times when the clock signal is making a transition from low-to-high or from high-to-low; rising edge 102 or falling edge 104, respectively.

Many microprocessor chips have their timing controlled by two or more related clock signals generated by an on-chip clock generator based on the master clock signal. FIG. 2A illustrates one such combination utilizing two clock signals identified by $\phi 1$ and $\phi 2$. This clocking arrangement provides four different edges and three different states per period, compared to only two edges and two states per period provided with a single clock signal as shown in FIG. 1. FIG. 2B illustrates examples of the three possible states for clock signals $\phi 1$ and $\phi 2$. For elements on the chip to function properly, it is important that edges of clock signals $\phi 1$ and $\phi 2$ are non-overlapping. If the edges overlap there will be more restrictions on data transfer and signal hand shaking.

For the non-overlapping clock signals $\phi 1$ and $\phi 2$ shown, the rising edge 202 of clock signal $\phi 1$ defines the beginning of a $\phi 1$ clock pulse, and the falling edge 204 defines the end of the $\phi 1$ clock pulse. Likewise, the rising edge 206 of clock signal $\phi 2$ defines the beginning of a $\phi 2$ clock pulse, and the falling edge 208 defines the end of the $\phi 2$ clock pulse. In STATE 1, both $\phi 1$ and $\phi 2$ reside at an inactive clock signal level, in this case a logic "0". Only one clock at a time is driven to an active clock signal level (e.g., a logic "1"). Complement clock signals, where only one phase at a time ever resides at a logic "0", are also entirely possible.

Additionally, it is equally important that non-overlapping clock pulses be evenly distributed to all corners of a chip regardless of the distance which those signals must travel. As chip size increases, clock signals $\phi 1$ and $\phi 2$ have to travel greater distances throughout the chip. This causes clock signals $\phi 1$ and $\phi 2$ to become degraded. As distances increase, rising edges 202, 206 and falling edges 204, 208 may become obscured (experience phase shifts and increases in transition times) and can overlap. This phenomenon, sometimes referred to as clock skew, is caused by a number of factors, including: loading, unwanted noise, coupling, capacitance, resistance, inductance and other debilitating effects.

To account for these factors, designers must separate the rising and falling edges 202, 204, 206, 208 of different clock signals (i.e., $\phi 1$ and $\phi 2$) with a large enough margin of time to allow for clock skew. For instance, falling edge 204 and rising edge 206 must be separated by a minimum temporal distance or amount of time (T) to avoid overlapping states; especially for level-triggering operations in metaloxide-silicon (MOS) technology. The larger T is, the less likely the chip will fail due to overlapping signals caused by skewing. The wide range of operating environments to which the chip(s) may be subject must be considered in selecting T. Therefore, to provide an adequate margin, manufacturers are forced to select T large enough to provide functionality in a worst-case environment. However, a large T is a significant cycle time constraint.

For this reason, two-phase non-overlapping clock signals are frequently generated on-chip, so that chip-to-chip I/O delays and skews do not add to the clock skew between clock phases. Clock frequency can be more easily increased and T reduced by using a two-phase clock generator on-board the integrated circuit itself, which is typically supplied with a single-phase externally-generated clock signal.

The testing of microprocessor integrated circuits presents many problems, including the synchronization of internal operation, while testing, with externally applied stimuli such as test vectors. Consequently, it is sometimes desirable to clock a microprocessor under testing conditions with externally supplied test clock signals rather than the internally generated clock signals normally utilized. But since many operations must be tested at full speed, and since it is difficult to externally clock the integrated circuit as fast as the internal clock signals may be operated, the integrated circuit must also be tested using the internally generated system clocks. Moreover, it is frequently desirable to clock the integrated circuit with test clocks and external stimuli to pre-condition certain portions of the integrated circuit under test, or to provide certain arguments, or to present certain conditions to portions of the integrated circuit under test. Subsequent to such pre-conditioning, the integrated circuit is clocked with system clocks to perform the at-speed test in question.

If, when the clock signals within the integrated circuit are transferred from the test clock signals to the system clock signals, certain clock "glitches" or narrow clocks occur, then the integrated circuit may malfunction and mar the validity of the test. What is needed, for example, is a clock signal multiplexer which affords synchronous transfer of clock signals, as would be provided internally to an integrated circuit, from a pair of non-overlapping test clock signals to a pair of non-overlapping system clock signals.

SUMMARY OF THE INVENTION

A synchronous multiplexer for clock signals, in accordance with a two-phase non-overlapping embodiment of the present invention, ensures that both internal clock signals start at an inactive clock signal level when a test mode control signal is deactivated. Moreover, the embodiment ensures that normal system clocking begins with a particular phase of the clock signals such as, for example, a first phase.

In one embodiment of the present invention, an apparatus which is responsive to a first control signal for multiplexing a first input clock signal and a second input clock signal into a first output clock signal includes: (1) a first blocking circuit for producing a first intermediate signal which follows the first input clock signal if the first control signal is set to a first logic value, and which first intermediate signal is otherwise set to an inactive clock signal level; (2) a first select circuit for coupling the second input clock signal to the first output clock signal if a second control signal is set to a second logic value, and otherwise for coupling the first intermediate signal to the first output clock signal; and (3) a control circuit for generating the second control signal, wherein the second control signal is set to the second logic value at a first predetermined time relative to the second input clock signal. For certain embodiments, the first predetermined time relative to the second input clock signal may be a time substantially beginning with a first full clock pulse of the second input clock signal which occurs after a transition of the first control signal from the first logic value.

Certain embodiments may also provide for multiplexing, responsive to the first control signal, a third input clock signal and a fourth input clock signal into a second output clock signal, and may further include: (1) a second blocking circuit for producing a second intermediate signal which follows the third input clock signal if the first control signal is set to the first logic value, and which second intermediate signal is otherwise set to the inactive clock signal level; and (2) a second select circuit for coupling the fourth input clock signal to the second output clock signal if the second control signal is set to the second logic value, and otherwise for coupling the second intermediate signal to the second output clock signal.

In yet another embodiment of the present invention, an apparatus, responsive to a first control signal, for synchronously multiplexing a first pair of clock signals (being first and second input clock signals) and a second pair of clock signals (being third and fourth input clock signals) onto a pair of output clock signals (being first and second output clock signals), the apparatus includes: (1) first means for coupling the first input clock signal to the first output clock signal if the first control signal is set to a first logic value, for driving the first output clock signal to an inactive clock signal level when the first control signal transitions from the first logic value, and for coupling the third input clock signal to the first output clock signal beginning with a first full clock pulse of the third input clock signal which occurs after the first control signal transitions from the first logic value; and (2) second means for coupling the second input clock signal to the second output clock signal if the first control signal is set to the first logic value, for driving the second output clock signal to the inactive clock signal level when the first control signal transitions from the first logic value, and for coupling the fourth input clock signal to the second output clock signal beginning with the first full clock pulse of the third input clock signal which occurs after the first control signal transitions from the first logic value.

In yet another embodiment of the present invention, an apparatus, responsive to a test mode control signal, for multiplexing a pair of test clock signals and a pair of system clock signals onto a pair of output clock signals includes: (1) first means for coupling a first test clock signal to a first output clock signal when the test mode control signal is active, for driving the first output clock signal to an inactive clock signal level when the test mode control signal transitions to an inactive state, and for coupling a first system clock signal to the first output clock signal beginning with a first full clock pulse of the first system clock signal which occurs after the test mode control signal transitions to the inactive state; and (2) second means for coupling a second test clock signal to a second output clock when the test mode control signal is active, for driving the second output clock to the inactive clock signal level when the test mode control signal transitions to the inactive state, and for coupling a second system clock signal to the second output clock beginning with a first full clock pulse of the second system clock signal which occurs after the first full clock pulse of the first system clock signal.

In yet another embodiment of the present invention, a method for multiplexing a first input clock signal and a second input clock signal onto a first output clock signal includes the steps of: (1) coupling the first input clock signal to the first output clock signal while the first control signal is active; (2) driving the first output clock signal to an inactive clock signal level when the first control signal transitions to an inactive state; and (3) coupling the second input clock signal onto the first output clock signal beginning with a first full clock pulse of the second input clock signal which occurs after the first control signal transitions to the inactive state.

Further features and advantages of the present invention, as well as the structure and operation of various embodiments of the present invention, are described in detail below with reference to the accompanying drawings.

BRIEF DESCRIPTION OF THE DRAWINGS

The present invention may be better understood, and its numerous objects, features, and advantages made apparent to those skilled in the art by referencing the accompanying drawings.

FIG. 1, labeled prior art, illustrates a square wave with a 50% duty cycle.

FIG. 2A, labeled prior art, illustrates two non-overlapping clock signals identified by $\phi1$ and $\phi2$.

FIG. 2B, labeled prior art, illustrates three possible states for the non-overlapping clock signals $\phi1$ and $\phi2$ shown in FIG. 2A.

In the drawings the left-most digit of a reference number identifies the drawing in which the reference number first appears. The use of the same reference symbols in different drawings indicates similar or identical items.

DESCRIPTION OF THE PREFERRED EMBODIMENT(S)

Figure 3:
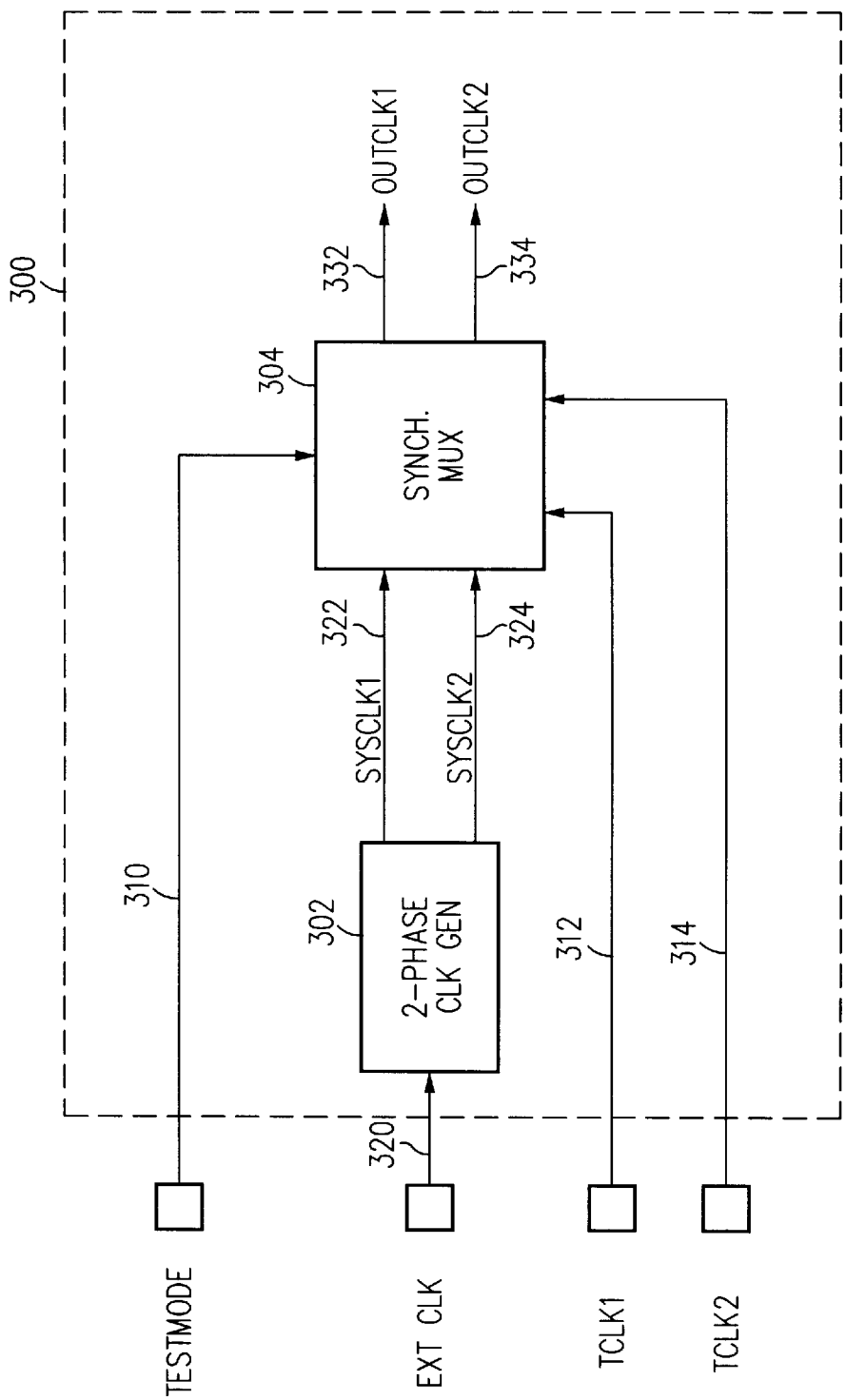
FIG. 3 illustrates a high-level block diagram of an environment in which the present invention operates.

FIG. 3 illustrates a high level block diagram of a preferred environment incorporating the present invention. Digital system 300 may be an integrated circuit, a computer system, or another digital system, either at a fabrication/testing stage or in a user environment. As illustrated, digital system 300 includes an external clock signal EXTCLK conveyed on clock line 320 to a two-phase non-overlapping clock generator 302, which generates a pair of non-overlapping system clock signals SYSCLK1 and SYSCLK2 conveyed, respectively, on clock lines 322 and 324 to a synchronous multiplexer 304. A pair of externally-provided non-overlapping test clock signals TCLK1 and TCLK2 are conveyed on clock lines 312 and 314, respectively, to the synchronous multiplexer 304. Lastly, a test mode signal TESTMODE is communicated via control line 310 to the synchronous multiplexer 304.

In a preferred embodiment, the clock signals SYSCLK1 and SYSCLK2 are similar to that shown in FIG. 2, as are the two test clock signals TCLK1 and TCLK2. The synchronous multiplexer 304 couples either the two system clock signals SYSCLK1 and SYSCLK2, or the two test clock signals TCLK1 and TCLK2, to the two output clock signals OUTCLK1 and OUTCLK2, respectively. When the test mode control signal TESTMODE is asserted (i.e., driven to an active state, driven to an active logic level, or "activated"), the SYSCLK1 and SYSCLK2 signals are conveyed to the OUTCLK1 and OUTCLK2 signals, respectively. Conversely, when the test mode control signal TESTMODE is de-asserted (i.e., driven to an inactive state, driven to an inactive logic level, or "de-activated"), the TCLK1 and TCLK2 signals are conveyed to the OUTCLK1 and OUTCLK2 signals, respectively. The particular behavior of the synchronous multiplexer 304 during and immediately after a transition of the TESTMODE control signal from one logic state to the other is further discussed in reference to FIG. 4 herebelow.

Figure 4:
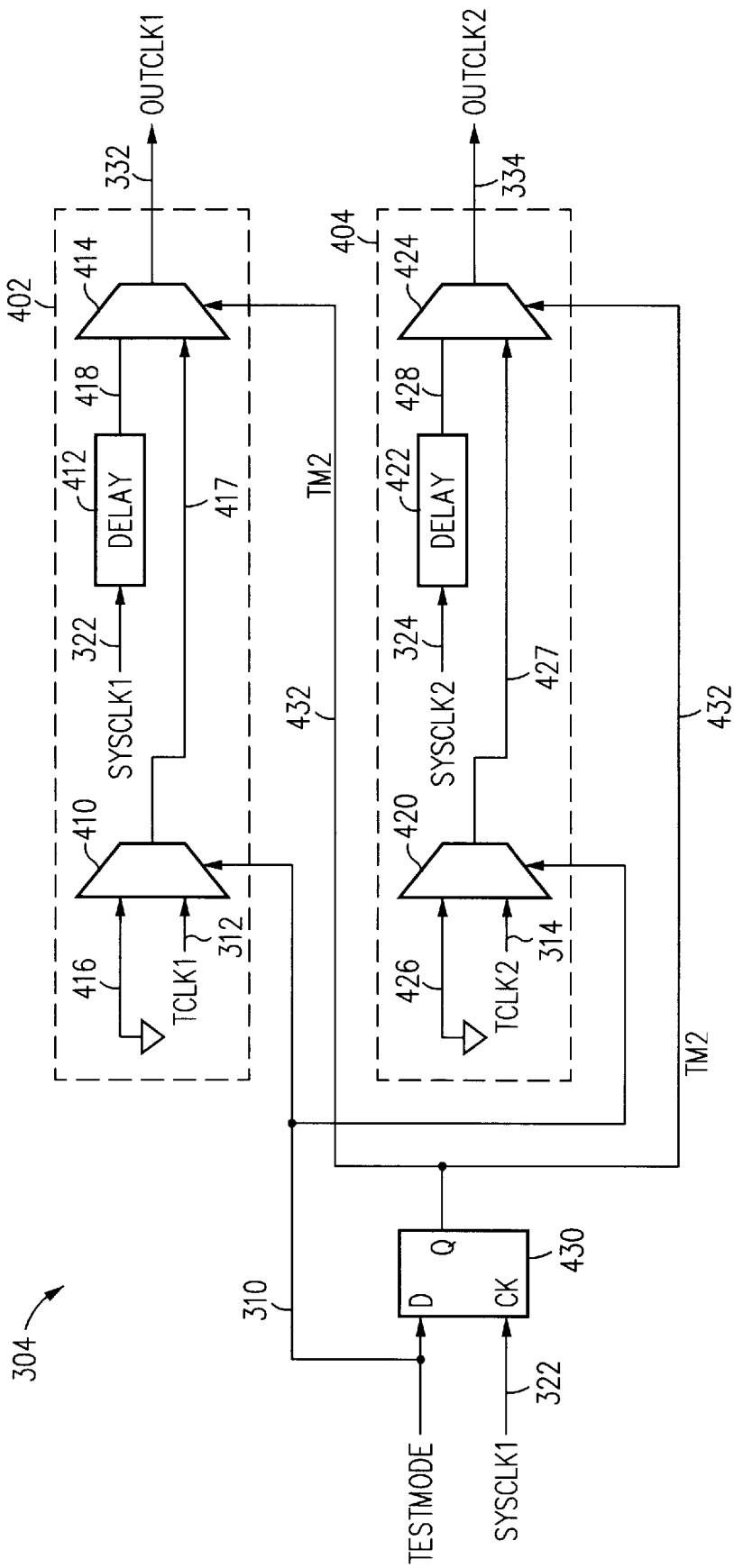
FIG. 4 illustrates one embodiment of a synchronous multiplexer according to the present invention.

Additional detail of the synchronous multiplexer 304 is shown in FIG. 4. Logic block 402 includes two multiplexers 410 and 414 and a delay circuit 412. The TCLK1 signal conveyed on clock line 312 is coupled to a first input terminal of multiplexer 410, and an inactive clock signal level, in this embodiment a logic "0" (i.e., a ground connection), is conveyed on line 416 to a second input terminal of multiplexer 410. The output of multiplexer 410 is an intermediate signal communicated on signal line 417 to a first input terminal of multiplexer 414. The SYSCLK1 signal conveyed on clock line 322 is coupled to the delay circuit 412, whose output terminal (line 418) is in turn coupled to a second input terminal of multiplexer 414. The output terminal of multiplexer 414, being line 332, communicates the OUTCLK1 signal.

Logic block 404 includes two multiplexers 420 and 424 and a delay circuit 422. The TCLK2 signal conveyed on clock line 314 is coupled to a first input terminal of multiplexer 420, and an inactive clock signal level, in this embodiment a logic "0" (i.e., a ground connection), is conveyed on line 426 to a second input terminal of multiplexer 420. The output of multiplexer 420 is an intermediate signal communicated on signal line 427 to a first input terminal of multiplexer 424. The SYSCLK2 signal conveyed on clock line 324 is coupled to the delay circuit 422, whose output terminal (line 428) is in turn coupled to a second input terminal of multiplexer 424. The output terminal of multiplexer 424, being line 334, communicates the OUTCLK2 signal.

D flip-flop 430 receives at a D-input terminal the TESTMODE signal conveyed on control line 310. The TESTMODE signal is also communicated to a respective control input terminal of multiplexers 410 and 420. D flip-flop 430 also receives the SYSCLK1 signal on a clock input terminal, and generates at a Q output terminal a second control signal TM2 conveyed on signal line 432 to a respective control input terminal of multiplexers 414 and 424. The TM2 control signal is a "delayed" version of the TESTMODE control signal.

Figure 5:
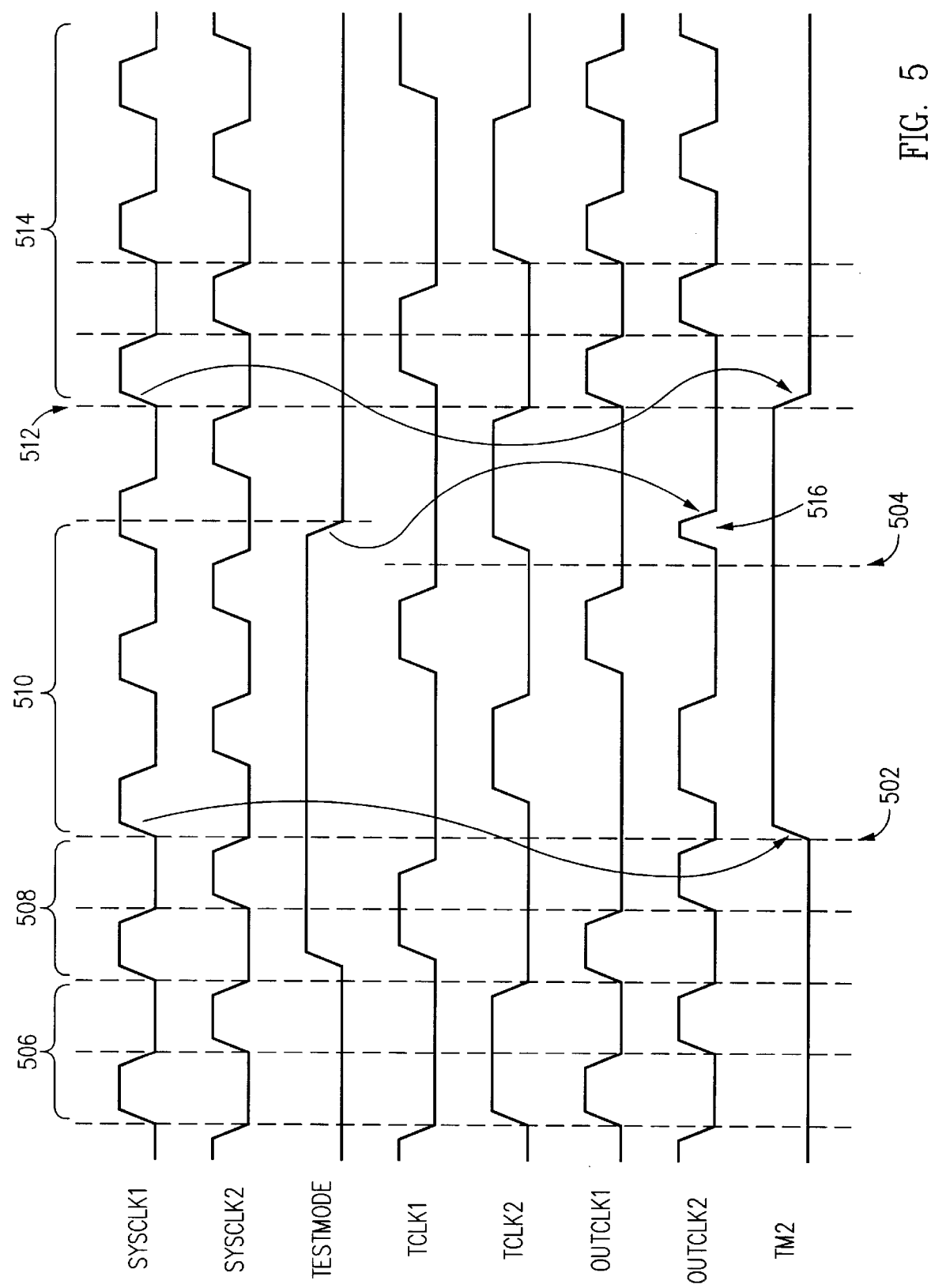
FIG. 5 illustrates a timing diagram of the operation of the embodiment shown in FIG. 4.

The operation of the embodiment shown in FIG. 4 can be more easily understood by reference to the timing diagrams depicted in FIG. 5. Initially, the TESTMODE control signal is low (i.e., inactive), which directs the synchronous multiplexer 304 to couple the SYSCLK1 and SYSCLK2 signals to the OUTCLK1 and OUTCLK2 signals, respectively. As shown during intervals 506 and 508, the OUTCLK1 and OUTCLK2 signals follow the SYSCLK1 and SYSCLK2 signals. (For clarity, propagation delays through the multiplexers 410, 414, 420, and 424 are not shown in FIG. 5.) When the TESTMODE signal transitions high (i.e., to a logic "1") in the early part of interval 508, the first intermediate signal (not shown in FIG. 5) conveyed on line 417 begins to follow the TCLK1 signal, and the second intermediate signal (not shown in FIG. 5) conveyed on line 427 begins to follow the TCLK2 signal. But since the TM2 control signal is still low, multiplexers 414, 424 remain directed to couple the delayed SYSCLK1 and delayed SYSCLK2 signals (rather than the respective intermediate signals) to the respective OUTCLK1 and OUTCLK2 signals.

When the first rising edge of the SYSCLK1 signal arrives after the TESTMODE signal has been asserted (as shown at time 502), the TM2 signal is driven high by flip-flop 430. Consequently, multiplexers 414 and 424 are then directed to couple the respective intermediate signals conveyed on lines 417 and 427 to the respective OUTCLK1 and OUTCLK2 signals. Thereafter the OUTCLK1 and OUTCLK2 signals follow the TCLK1 and TCLK2 signals as long as the TESTMODE signal remains asserted, as is shown during interval 510.

When the TESTMODE signal is de-asserted (as shown at the end of interval 510), the multiplexers 410, 420 are immediately (i.e., asynchronously) directed to couple the inactive clock signal level (here, for example, a ground potential) to their respective outputs, and consequently the OUTCLK1 and OUTCLK2 signals are likewise driven to ground potential by respective multiplexers 414, 424. This ground potential represents the inactive clock signal level. Multiplexers 410, 420 act as "blocking" circuits which block the test clock signals from reaching the OUTCLK1 and OUTCLK2 signals. Then, upon the beginning of the first full clock pulse of the SYSCLK1 signal (shown at time 512), the flip-flop 430 likewise de-asserts the TM2 signal, and multiplexers 414, 424 are directed to couple the delayed SYSCLK1 and delayed SYSCLK2 signals to the respective OUTCLK1 and OUTCLK2 signals, respectively, as shown in interval 514.

Delay circuit 412 is provided to compensate for the clock-to-Q propagation delay through flip-flop 430, measured from the rising edge of SYSCLK1 signal to the TM2 signal being driven by flip-flop 430. As a result, the multiplexer 414 is redirected to steer the delayed SYSCLK1 signal arriving on line 418 just before the rising edge of the first full clock pulse on the SYSCLK1 signal. For example, at time 512 the delay circuit 412 provides enough delay so that the multiplexer 414 "switches inputs" in time to communicate the first full clock pulse of the SYSCLK1 signal (which occurs after the transition of the TESTMODE signal to an inactive state) to the OUTCLK1 signal. Without such compensation, the first clock pulse on the OUTCLK1 signal would be narrower than subsequent clock pulses, which could easily result in circuit misoperation compared to full-width clock pulses normally communicated through multiplexer 414.

The delay circuit 422 is provided to balance the delay arising from the delay circuit 412 so as to balance the clock skew between the SYSCLK1 and SYSCLK2 signals. Delay circuits 412, 422 may be fashioned from a variety of gate delay circuits, and preferably are designed to match (or alternatively to exceed) the clock-to-Q propagation delay through flip-flop 430.

To clarify the operation of the synchronous multiplexer 304, the timing diagram shown in FIG. 5 includes a "short" or "narrow" clock pulse 516 on the OUTCLK2 signal. This results from the asynchronous nature in forcing an inactive clock signal level immediately upon the TESTMODE signal being de-asserted. In a preferred mode of operation, however, the TCLK1 and TCLK2 signals are coordinated with the TESTMODE signal (since all three are typically externally generated, for example, by external test equipment) so that both the TCLK1 and TCLK2 signals are already driven to the inactive clock signal level when the TESTMODE signal is de-asserted. For example, if the TESTMODE signal is deasserted at time 504, both the TCLK1 and TCLK2 signals are already at a logic "0" level, and no "narrow" clock pulse would result on either the OUTCLK1 or OUTCLK2 signals when multiplexers 410, 420 are enabled to couple the ground level (by way of multiplexers 414, 424) to the OUTCLK1 and OUTCLK2 signals.

Additionally, in a preferred mode of operation, the TCLK1 and TCLK2 signals are also coordinated with the assertion of the TESTMODE signal as well, so that both the TCLK1 and TCLK2 signals are stable at the inactive clock signal level when the TESTMODE signal is asserted, and remain so for some time thereafter (e.g., for 1–2 clock pulses on the SYSCLK1 signal), followed by an initial clock pulse on the TCLK1 signal before a clock pulse on the TCLK2 signal (contrary to that shown for illustrative purposes in FIG. 5). In this way, proper circuit operation is maintained by the TCLK1 signal pulsing before the TCLK2 signal (upon entering into a test mode of operation) and also by the SYSCLK1 signal pulsing before the SYSCLK2 signal (upon re-entering normal system operation).

Since the internally-generated SYSCLK1 and SYSCLK2 signals are high speed and free-running compared to the externally provided TESTMODE signal, the synchronous multiplexer 304 provides controlled clocking signals which ensures that, when leaving the test mode of operation, the OUTCLK1 and OUTCLK2 signals both start from the inactive clock signal level, and that first clock pulse occurs on the OUTCLK1 signal (as it follows the SYSCLK1 signal).

While the invention has been largely described with respect to the embodiments set forth above, the invention is not necessarily limited to these embodiments. For example, a wide variety of circuits may be employed to form the multiplexer 410, 414, 420, 424, which are well known in the art. The polarity of various signals may be freely complemented. For example, active-low clock pulses (e.g., the inactive clock signal level being a logic "1") may be accommodated by using an inverting clock input on flip-flop 430 and by conveying a logic "1" level (e.g., VDD voltage) to nodes 416, 426. Other numbers of clock phases than two may be provided for. Moreover, the clock signals need not be non-overlapping. Other types of blocking circuits may be provided rather than the multiplexer 410, 420 shown, such as a simple NAND or NOR logic gate circuit which selectively passes a clock signal when an input signal is set to a first logic state, and grounds its output signal when set to the other logic state. Other types of flip-flops than D-type flip-flops may easily be configured to provide the TM2 control signal. Accordingly, other embodiments, variations, and improvements not described herein are not necessarily excluded from the scope of the invention, which is defined by the following appended claims.

What is claimed is:

1. An apparatus, responsive to a first control signal, for multiplexing a first input clock signal and a second input clock signal into a first output clock signal and for multiplexing, responsive to the first control signal, a third input clock signal and a fourth input clock signal into a second output clock signal, said apparatus comprising:

a first blocking circuit for producing a first intermediate signal which follows the first input clock signal when the first control signal is set to a first logic value, and which first intermediate signal is otherwise set to an inactive clock signal level;

a first select circuit for coupling the second input clock signal to the first output clock signal when a second control signal is set to a second logic value, and otherwise for coupling the first intermediate signal to the first output clock signal;

a control circuit for generating the second control signal, wherein the second control signal is set to the second logic value at a first predetermined time relative to the second input clock signal;

a second blocking circuit for producing a second intermediate signal which follows the third input clock signal if the first control signal is set to the first logic value, and which second intermediate signal is otherwise set to the inactive clock signal level; and a second select circuit for coupling the fourth input clock signal to the second output clock signal if the second control signal is set to the second logic value, and otherwise for coupling the second intermediate signal to the second output clock signal.

2. An apparatus as in claim 1 wherein the first predetermined time relative to the second input clock signal comprises:

a time substantially beginning with a first full clock pulse of the second input clock signal which occurs after a transition of the first control signal from the first logic value.

3. An apparatus as in claim 2 wherein:

the second control signal is set to a logic value opposite the second logic value at a second predetermined time relative to the second input clock signal.

4. An apparatus as in claim 3 wherein the second predetermined time relative to the second input clock signal comprises:

a time substantially beginning with a first full clock pulse of the second input clock signal which occurs after a transition of the first control signal to the first logic value.

5. An apparatus, responsive to a first control signal, for multiplexing a first input clock signal and a second input clock signal into a first output clock signal, said apparatus comprising:

a first blocking circuit for producing a first intermediate signal which follows the first input clock signal when the first control signal is set to a first logic value, and which first intermediate signal is otherwise set to a predetermined potential level;

a first select circuit for coupling the second input clock signal to the first output clock signal when a second control signal is set to a second logic value, and otherwise for coupling the first intermediate signal to the first output clock signal; and a control circuit for generating the second control signal, wherein the second control signal is set to the second logic value at a first predetermined time relative to the second input clock signal;

wherein said first blocking circuit comprises a first multiplexer having a first input terminal for receiving the predetermined potential level, having a second input terminal for receiving the first input clock signal, having a control terminal for receiving the first control signal, and having an output terminal for communicating the first intermediate signal thereon.

6. An apparatus, responsive to a first control signal, for multiplexing a first input clock signal and a second input clock signal into a first output clock signal, said apparatus comprising:

a first blocking circuit for producing a first intermediate signal which follows the first input clock signal when the first control signal is set to a first logic value, and which first intermediate signal is otherwise set to a predetermined potential level;

a first select circuit for coupling the second input clock signal to the first output clock signal when a second control signal is set to a second logic value, and otherwise for coupling the first intermediate signal to the first output clock signal; and a control circuit for generating the second control signal, wherein the second control signal is set to the second logic value at a first predetermined time relative to the second input clock signal;

wherein said first select circuit comprises a second multiplexer having a first input terminal for receiving the second input clock signal, having a second input terminal for receiving the first intermediate signal, having a control terminal for receiving the second control signal, and having an output terminal for communicating the first output clock signal thereon.

7. An apparatus as in claim 6 wherein said first select circuit further comprises:

a first delay circuit for delaying the second input clock signal coupled to the second multiplexer, said first delay circuit having a first input terminal for receiving the second input clock signal, and having an output terminal coupled to the first input terminal of the second multiplexer circuit.

8. An apparatus as in claim 6 wherein said control circuit comprises:

a flip-flop circuit for generating the second control signal responsive to the first control signal and to the second input clock signal, said flip-flop circuit having a first input terminal for receiving the first control signal, having a clock input terminal for receiving the second input clock signal, and having an output terminal for communicating the second control signal thereon.

9. An apparatus as in claim 8 wherein said flip-flop circuit comprises:

a D flip-flop.

10. An apparatus as in claim 1 wherein said second and fourth input clock signals together comprise:

a pair of non-overlapping clock signals.

11. An apparatus as in claim 10 wherein said first and third input clock signals together comprise:

a pair of non-overlapping clock signals.

12. An apparatus as in claim 11 wherein said inactive clock signal level comprises a logic "0" level.

13. An apparatus as in claim 1 wherein:

the first predetermined time relative to the second input clock signal comprises a time substantially beginning with a first full clock pulse of the second input clock signal which occurs after a transition of the first control signal from the first logic value;

the second control signal is set to a logic value opposite the second logic value at a second predetermined time relative to the second input clock signal; and the second predetermined time relative to the second input clock signal comprises a time substantially beginning with a first full clock pulse of the second input clock signal which occurs after a transition of the first control signal to the first logic value.

14. An apparatus as in claim 13 wherein:

said first blocking circuit comprises a first multiplexer having a first input terminal for receiving the inactive clock signal level, having a second input terminal for receiving the first input clock signal, having a control terminal for receiving the first control signal, and having an output terminal for communicating the first intermediate signal thereon;

said first select circuit comprises a second multiplexer having a first input terminal for receiving the second input clock signal, having a second input terminal for receiving the first intermediate signal, having a control terminal for receiving the second control signal, and having an output terminal for communicating the first output clock signal thereon; and said first select circuit further comprises a first delay circuit for delaying the second input clock signal coupled to the second multiplexer, said first delay circuit having a first input terminal for receiving the second input clock signal, and having an output terminal coupled to the first input terminal of the second multiplexer.

15. An apparatus as in claim 14 wherein said control circuit comprises:

a flip-flop circuit for generating the second control signal responsive to the first control signal and to the second input clock signal, said flip-flop circuit having a first input terminal for receiving the first control signal, having a clock input terminal for receiving the second input clock signal, and having an output terminal for communicating the second control signal thereon.

16. An apparatus as in claim 14 wherein:

said second blocking circuit comprises a third multiplexer having a first input terminal for receiving the inactive clock signal level, having a second input terminal for receiving the third input clock signal, having a control terminal for receiving the first control signal, and having an output terminal for communicating the second intermediate signal thereon;

said second select circuit comprises a fourth multiplexer having a first input terminal for receiving the fourth input clock signal, having a second input terminal for receiving the second intermediate signal, having a control terminal for receiving the second control signal, and having an output terminal for communicating the second output clock signal thereon; and said second select circuit further comprises a second delay circuit for delaying the fourth input clock signal coupled to the fourth multiplexer, said second delay circuit having a first input terminal for receiving the fourth input clock signal, and having an output terminal coupled to the first input terminal of the fourth multiplexer.

17. An apparatus as in claim 16 wherein:

said first and third input clock signals together comprise a pair of non-overlapping test clock signals; and said second and fourth input clock signals together comprise a pair of non-overlapping system clock signals.

18. An apparatus, responsive to a first control signal, for synchronously multiplexing a first pair of clock signals and a second pair of clock signals onto a pair of output clock signals, said first pair comprising first and second input clock signals, said second pair comprising third and fourth input clock signals, and the output pair comprising first and second output clock signals, said apparatus comprising:

first means for coupling the first input clock signal to the first output clock signal when the first control signal is set to a first logic value, for driving the first output clock signal to an inactive clock signal level when the first control signal transitions from the first logic value, and for coupling the third input clock signal to the first output clock signal beginning with a first full clock pulse of the third input clock signal which occurs after the first control signal transitions from the first logic value; and second means for coupling the second input clock signal to the second output clock signal when the first control signal is set to the first logic value, for driving the second output clock signal to the inactive clock signal level when the first control signal transitions from the first logic value, and for coupling the fourth input clock signal to the second output clock signal beginning with said first full clock pulse of the third input clock signal which occurs after the first control signal transitions from the first logic value.

19. An apparatus as in claim 18 wherein said first means comprises:

first selection means, responsive to the first control signal, for producing at an output thereof a signal selected from the first input clock signal and the inactive clock signal level; and second selection means, responsive to a synchronously-delayed version of the first control signal provided as a second control signal, for selecting between the third input clock signal and the output signal from the first selection means.

20. An apparatus as in claim 19 wherein said first selection means comprises:

a first multiplexer having a first input terminal for receiving the inactive clock signal level, having a second input terminal for receiving the first input clock signal, having a control terminal for receiving the first control signal, and having an output terminal for communicating the output signal of said first selection means.

21. An apparatus, responsive to a test mode control signal, for multiplexing a pair of test clock signals and a pair of system clock signals onto a pair of output clock signals, said apparatus comprising:

first means for coupling a first test clock signal to a first output clock signal when the test mode control signal is active, for driving the first output clock signal to an inactive clock signal level when the test mode control signal transitions to an inactive state, and for coupling a first system clock signal to the first output clock signal beginning with a first full clock pulse of the first system clock signal which occurs after the test mode control signal transitions to the inactive state; and second means for coupling a second test clock signal to a second output clock when the test mode control signal is active, for driving the second output clock to the inactive clock signal level when the test mode control signal transitions to the inactive state, and for coupling a second system clock signal to the second output clock beginning with a first full clock pulse of the second system clock signal which occurs at the beginning of said first full clock pulse of the first system clock signal.

22. An apparatus as in claim 21 wherein said first means comprises:

first selection means, responsive to the test mode control signal, for producing at an output thereof a signal selected from the first test clock signal and the inactive clock signal level; and second selection means, responsive to a synchronously-delayed version of the test mode control signal provided as a second control signal, for selecting between the first system clock signal and the output signal from the first selection means.

23. An apparatus as in claim 22 wherein said first selection means comprises:

a first multiplexer having a first input terminal for receiving the inactive clock signal level, having a second input terminal for receiving the first test clock signal, having a control terminal for receiving the test mode control signal, and having an output terminal for communicating the output signal of said first selection means thereon.

24. An apparatus as in claim 23 wherein said second selection means comprises:

a second multiplexer having a first input terminal for receiving the first system clock signal, having a second input terminal coupled to the output terminal of the first multiplexer, having a control terminal for receiving the second control signal, and having an output terminal for communicating the first output clock signal thereon.

25. An apparatus as in claim 24 wherein said second selection means further comprises:

a flip-flop for generating the second control signal responsive to the test mode control signal and to the first system clock signal, said flip-flop having a first input terminal for receiving the test mode control signal, having a clock input terminal for receiving the first system clock signal, and having an output terminal for communicating the second control signal thereon.

26. An apparatus as in claim 25 wherein said second selection means further comprises:

a delay circuit for delaying the first system clock signal coupled to the second multiplexer, said delay circuit having a first input terminal for receiving the first system clock signal, and having an output terminal coupled to the first input terminal of the second multiplexer.

27. An apparatus as in claim 25 wherein said flip-flop comprises:

a D flip-flop.

28. An apparatus as in claim 21 wherein said first and second system clock signals together comprise:

non-overlapping clock signals.

29. An apparatus as in claim 28 wherein said first and second test clock signals together comprise:

non-overlapping clock signals.

30. An apparatus as in claim 29 wherein said inactive clock signal level comprises a logic "0" level.

31. An apparatus as in claim 30 wherein said inactive state comprises a logic "0" level.

32. A method for multiplexing a first input clock signal and a second input clock signal onto a first output clock signal and for multiplexing a third input clock signal and a fourth input clock signal onto a second output clock signal, said method comprising:

coupling the first input clock signal to the first output clock signal while a first control signal is active;

driving the first output clock signal to an inactive clock signal level when the first control signal transitions to an inactive state;

coupling the second input clock signal onto the first output clock signal beginning with a first full clock pulse of the second input clock signal which occurs after the first control signal transitions to the inactive state;

coupling the third input clock signal to the second output clock signal while the first control signal is active;

driving the second output clock signal to an inactive clock signal level when the first control signal transitions to an inactive state; and coupling the fourth input clock signal to the second output clock signal at the beginning of the first full clock pulse of the second input clock signal which occurs after the first control signal transitions to the inactive state.

33. A method as in claim 32 further comprising:

coupling the first input clock signal to the first output clock signal substantially when, after the first control signal transitions to an active state, a first clock pulse of the second input clock signal begins.

34. An integrated circuit for carrying out the method of claim 33.

* * * * *